(12) United States Patent
Alexander et al.

(10) Patent No.: US 8,908,890 B2
(45) Date of Patent: Dec. 9, 2014

(54) CIRCUIT ARRANGEMENT FOR ADJUSTING THE OUTPUT POWER AND/OR THE FREQUENCY RESPONSE OF A POWER AMPLIFIER FOR A HEARING AID DEVICE

(75) Inventors: Christian Alexander, Erlangen (DE); Thomas Dickel, Buttenheim (DE); Gunter Sauer, Erlangen (DE); Tom Weidner, Erlangen (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 1052 days.

(21) Appl. No.: 11/983,346

(22) Filed: Nov. 8, 2007

(65) Prior Publication Data
US 2008/0123881 A1    May 29, 2008

(30) Foreign Application Priority Data
Nov. 8, 2006   (EP) .................................. 06023272

(51) Int. Cl.
*H04R 25/00*   (2006.01)
*H03F 3/187*   (2006.01)
*H03F 3/68*    (2006.01)
*H03F 3/21*    (2006.01)
*H03F 3/72*    (2006.01)

(52) U.S. Cl.
CPC ............ *H04R 25/70* (2013.01); *H04R 2225/59* (2013.01); *H03F 3/187* (2013.01); *H03F 2200/421* (2013.01); *H03F 3/68* (2013.01); *H03F 2203/21145* (2013.01); *H03F 3/211* (2013.01); *H03F 2200/03* (2013.01); *H03F 2203/7221* (2013.01); *H03F 3/72* (2013.01)
USPC ............................ 381/312; 381/320; 381/120

(58) Field of Classification Search
USPC .......... 381/312, 314, 317, 320, 321, 323, 93, 381/98, 120, 123
See application file for complete search history.

(56) References Cited

U.S. PATENT DOCUMENTS 3,571,529 A * 3/1971 Gharib et al. ................. 381/321
4,548,082 A   10/1985 Engebretson et al.
(Continued)

FOREIGN PATENT DOCUMENTS

| DE | 26 41 675 A1 | 3/1978 |
|----|--------------|--------|
| EP | 0 098 421 A2 | 1/1984 |
| GB | 1506295      | 4/1978 |
| GB | 2091065 A1   | 7/1982 |

(Continued)

OTHER PUBLICATIONS

Harry Levitt; "Issue in the Development of Digital hearing Aids"; Speech Technology; Sep./Oct., 1988; pp. 1-4; vol. 4, No. 3; XP 000111145; New York, NY, USA.

*Primary Examiner* — Huyen D Le

(57) ABSTRACT

With a hearing aid device, the problem arises of having to match the output power and/or the frequency response of the hearing aid device to the level of hearing impairment of the patient as precisely as possible. In such cases allowance must be made for the noise level, which is a function of the technology used, to be kept as low as possible and for the signal-to-noise level to be as great as possible. A switching arrangement and/or a hearing aid device and method are provided in which the power amplifier is embodied with at least two output stages. The outputs of the individual output stages can be connected in parallel by means of a controllable switching facility. A simple adjustment of the output power and/or frequency response can be achieved in this way by simply connecting a corresponding number of output stages in parallel.

20 Claims, 2 Drawing Sheets

(56) References Cited

U.S. PATENT DOCUMENTS

| | | | |
|---|---|---|---|
| 5,321,758 A * | 6/1994 | Charpentier et al. | ......... 381/317 |
| 6,590,448 B1 | 7/2003 | Burt | |
| 6,934,400 B1 | 8/2005 | Vonlanthen | |
| 2002/0153947 A1 | 10/2002 | Andersson | |

FOREIGN PATENT DOCUMENTS

| WO | WO 9009760 A1 | 9/1990 |
|---|---|---|
| WO | WO 9847314 A2 | 10/1998 |
| WO | WO 01/39546 A1 | 5/2001 |

\* cited by examiner

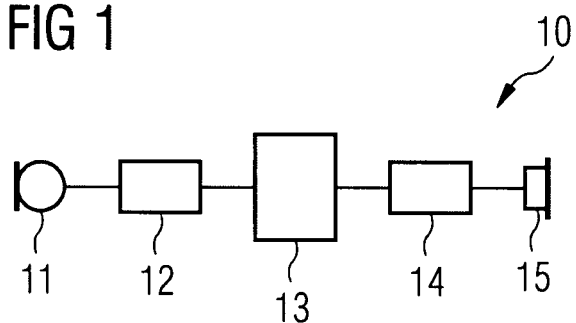
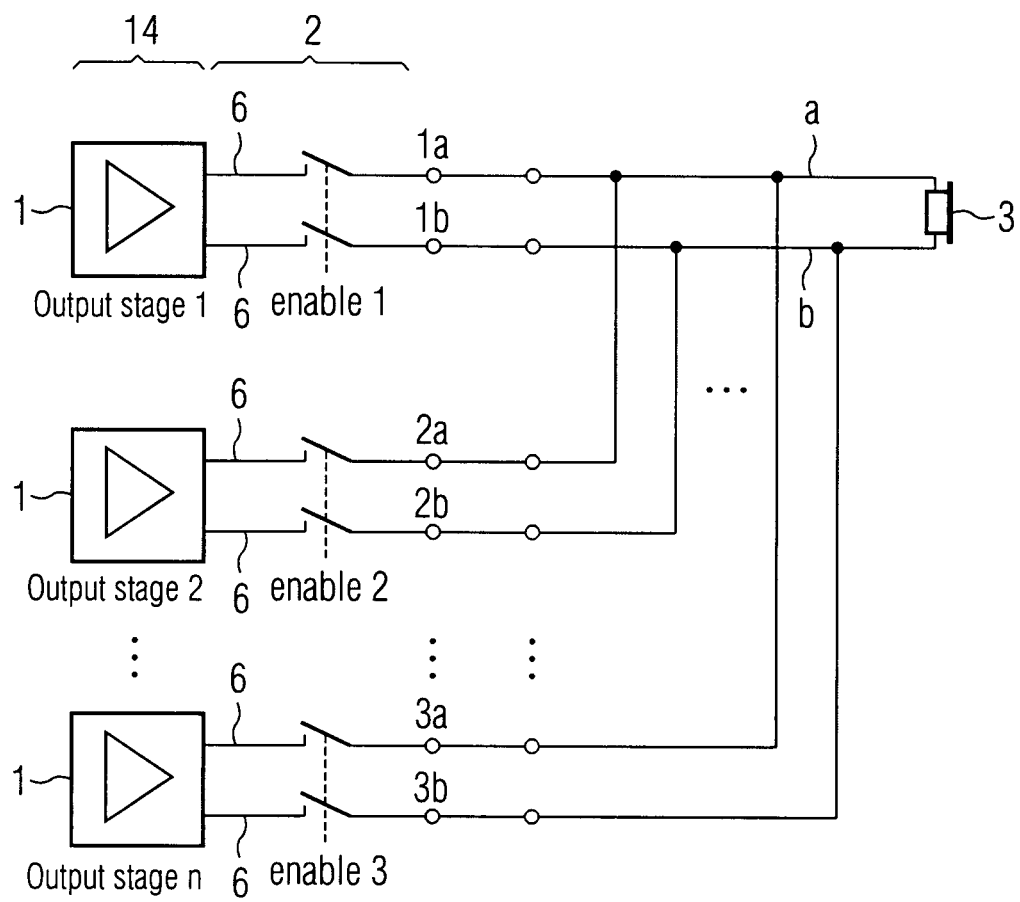

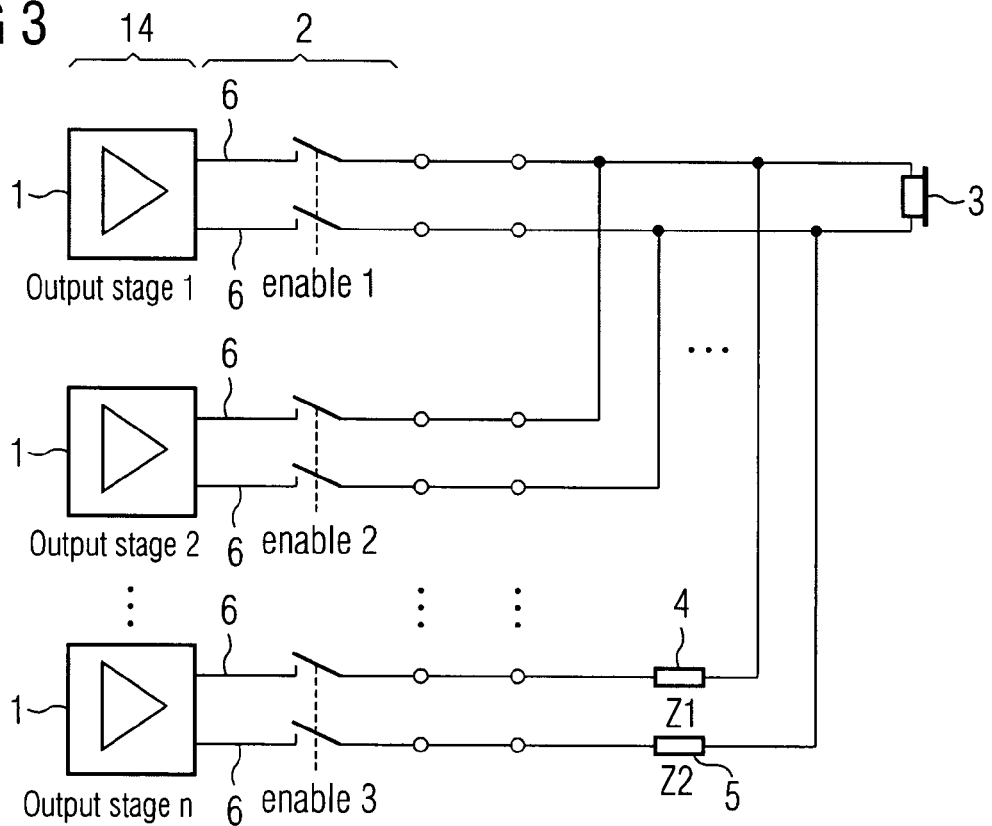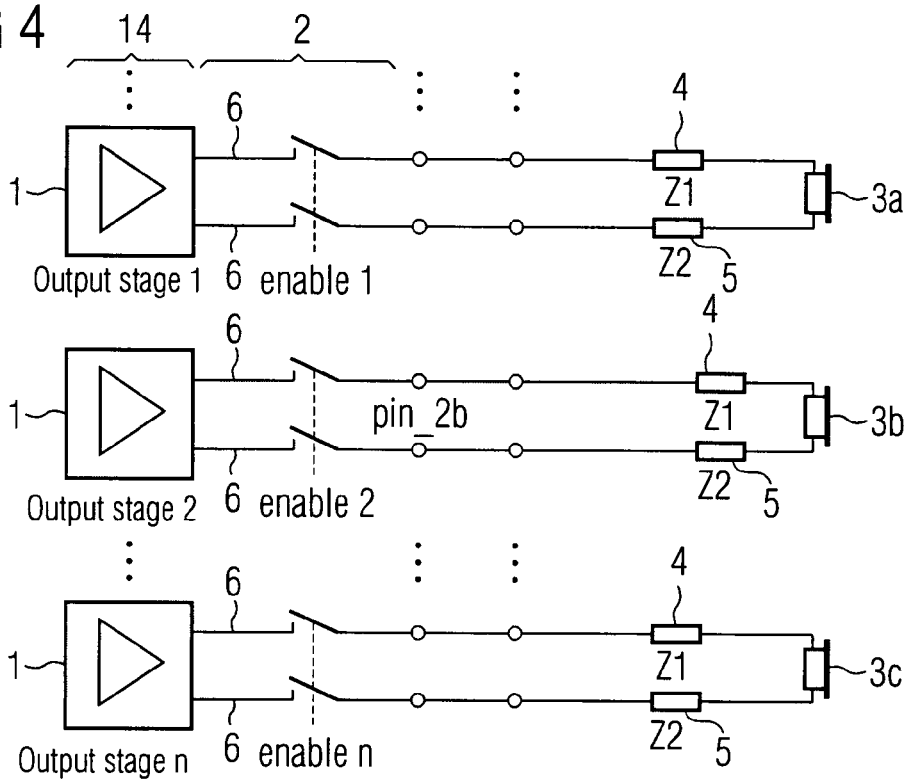

CIRCUIT ARRANGEMENT FOR ADJUSTING THE OUTPUT POWER AND/OR THE FREQUENCY RESPONSE OF A POWER AMPLIFIER FOR A HEARING AID DEVICE

CROSS REFERENCE TO RELATED APPLICATIONS

This application claims priority of European Patent Office application No. 06023272.5 EP filed Nov. 8, 2006, which is incorporated by reference herein in its entirety.

FIELD OF INVENTION

The invention relates to a circuit arrangement for adjusting the output power and/or the frequency response of a power amplifier in a hearing aid device as well as a hearing aid device and/or a method according to the independent claims. Hearing aid devices for compensating a person's impaired hearing are already known. With a known hearing aid device, the ambient noise is recorded by a microphone, amplified with a preamplifier, filtered with a signal processing unit, adjusted and then the volume is controlled. The power amplifier then transmits the useful signal to a connected receiver directly in the ear of the patient. The overall hearing aid device is designed in a very compact fashion and is located on or in the ear of the patient.

BACKGROUND OF INVENTION

As the level of hearing impairment may vary significantly with individual patients, the hearing aid device must be programmed for each individual case such that the patient is in particular able to listen to and understand even very quiet tone signals or noises. Very loud tone signals are however less significantly amplified, since they can be better perceived by the patient. There is also the problem of the signal-to-noise ratio being sufficiently high for an amplified tone signal to be output with the lowest possible noise level, in order herewith to achieve the best possible understanding. To solve this problem, in the case of known hearing aid devices, the sound pressure level emitted by the loudspeaker is controlled as a function of the sound pressure level recorded on the microphone. In such cases the transmitted frequency range is herewith divided into two or more amplification channels and is controlled separately by corresponding control loops. The division into sub regions is carried out by input-side filters, which are connected to their own dynamics controller.

DE 2641675 A1 discloses a hearing aid device having an audio frequency amplifier, which amplifies the audio signals recorded by a microphone and forwards them to a receiver. The audio frequency amplifier has at least two transmission channels which are connected in parallel. On the input side, each transmission channel contains a filter with a control amplifier arranged downstream thereof. In this way, the filters are designed such that each filter lets a different sub region of the audio frequency range through. In addition, an adjustable frequency-dependent network is embodied in each transmission channel behind the control amplifier. The individual transmission channels are combined on the output side and fed to a power amplifier, which finally controls the receiver.

SUMMARY OF INVENTION

The object underlying the invention is to create a hearing aid device, which can be adapted for different performance classes using very simple means. This object is achieved by the features of the dependent claims.

With the circuit arrangement according to the invention for adjusting the output power and/or the hearing aid device or the method having the characterizing features of the independent claims, it is advantageous if only one single assembly platform is required for all performance classes, i.e. for all levels of hearing impairment. The hearing aid device can herewith be manufactured considerably more cost-effectively. A further advantage is that in comparison with the known prior art, the output power and/or the frequency response can be adjusted in a very simple fashion, since the power amplifier comprises at least two output stages, which are embodied with a separate output. Each output stage is embodied with a predetermined fixed output power and/or with a predetermined frequency response. With the aid of very simple, controllable switching facility, the outputs of at least two output stages can be connected in parallel depending on requirements and then mutually operate the receiver. This additional linking of output stages enables practically any output power and/or frequency response to be adjusted or programmed by an acoustician/person skilled in the art for instance. The hearing aid device can herewith be individually adjusted to the patient's level of hearing impairment using very simple means.

The measures listed in the dependent claims allow advantageous developments and improvements of the circuit arrangement and/or the hearing aid device according to the independent claims. It is deemed particularly advantageous that the individual output stages are embodied with an individual output power and/or frequency response. In the case of a number of output stages, which are produced with a correspondingly graduated output power, all desired output powers can thus be generated by means of a simple parallel connection.

Designing the individual output stages with an individual, different output power and/or different frequency response also particularly reduces the unavoidable noises (white noise), as the noise signal increases with an increasing output power. For example, with a lower level of hearing impairment, the transmitted useful signal can be optimally adjusted in the case of minimal noises by reducing the number of active output stages.

The parallel connection of the outputs of the individual output stages is effected using a switching facility. The switching facility is preferably embodied as an electronic switch. The status is stored in a non-volatile memory, an EEPROM or a flash memory for instance.

In a further embodiment of the invention, provision is made for an external protective element to be arranged between the switching facility and the receiver. This external protective element likewise allows the output power of the relevant output stage to be restricted. Provision is made for the external protective element to comprise passive components, preferably a resistor, an R/C filter, a coupling capacitor or suchlike. This also allows the frequency response to be influenced in a desired manner. The high frequencies can be more greatly emphasized using a coupling capacitor for instance.

One further aspect of the invention consists in each output stage being connectable to a separate receiver. In this process, the individual receivers can be designed for different frequency ranges, as a tweeter, middle-range or woofer for instance.

Provision is made for the circuit arrangement to be embodied as an integrated circuit and to be integrated preferably on a hearing device chip.

BRIEF DESCRIPTION OF THE DRAWINGS

An exemplary embodiment of the invention is shown in the drawing and is described in more detail below:

FIG. 1 shows a schematic illustration of a block diagram of a known hearing aid device, FIG. 2 shows a first exemplary embodiment of the invention having a power amplifier, which is embodied with three output stages, FIG. 3 shows a block diagram of a second exemplary embodiment of the invention and FIG. 4 shows a block diagram of a third exemplary embodiment of the invention.

DETAILED DESCRIPTION OF INVENTION

To better understand the invention, the structure of a known hearing aid device is firstly described in more detail with reference to a simplified block diagram according to FIG. 1. A hearing aid device 10 essentially comprises a microphone 11, which records the acoustic audio signals, voice signals or ambient noises for instance, and converts said signals into electrical signals. As the recorded acoustic audio signals contain both useful frequencies as well as interference frequencies, these are converted into corresponding electrical signals and are amplified in a preamplifier 12 arranged downstream thereof. A signal processing unit 13 is connected to the preamplifier 12, with which signal processing unit the electrical signals are filtered and processed such that the most interference-free useful signal possible is produced. To this end, a number of transmission channels are generally used, which are designed with corresponding filters and controllers.

The output of the signal processing unit 13 is connected to an input of a power amplifier 14, which amplifies the filtered useful signal and thus controls a receiver 15 arranged downstream thereof.

Furthermore, the signal processing unit 13 contains a volume controller, with which a desired acoustic volume can be adjusted on the receiver 15. This structure of a hearing aid device which is illustrated schematically is known per se.

A power amplifier with a fixed output power was previously used for instance. This means that with a low level of hearing impairment, although the output power can be reduced, the noise signal of the output stage nevertheless remains unchanged and high. Explicit adaptation to the hearing impairment is thus only possible under some conditions using the known device.

FIG. 2 shows a schematic illustration of a block diagram for a first exemplary embodiment of the invention. FIG. 2 shows a power amplifier 14, which is typically embodied with three independent output stages 1. The number of output stages 1 is not essential to the invention. Provision is made for at least two independent output stages 1 to be embodied. Each output stage 1 has a two-pole output 6, which is connected to a controllable switching facility 2. The controllable switching facility 2 is preferably embodied as a semiconductor switch and is actuated by a control facility (not shown in FIG. 2) and/or programmed such that the switch setting is either permanently closed (enable 1, enable 2, enable 3) or permanently open. An opened switch setting is shown in each instance. The control facility essentially comprises a non-volatile memory, which can be embodied as an EEPROM or a flash memory for instance. In the non-volatile memory, an item of status information for the switch setting of the switching contacts is stored for each output stage.

Each of the three switching facilities 2 shown in FIG. 2 is connected in parallel with one another on the output side, i.e. that the terminals 1a, 2a and 3a as well as terminals 1b, 2b and 3b are connected to one another. A receiver 3 is connected at this parallel connection to the lines a and b. The closure of the switching contacts, which is embodied in the form of corresponding output switching transistors in the embodiment as an integrated circuit, thus causes each output stage 1 to be individually connectable to the receiver 3. If all 3 two-pole switches of the switching facility 3 are closed for instance, then all three output stages 1 are automatically connected in parallel to the receiver 3. By contrast, with two closed switching contacts of the switching facility 2, only the corresponding two output stages 1 are connected to the receiver 3, the third output stage is ineffective in this case.

Provision is made in accordance with the invention for the output power and/or the frequency response of the individual output stages 1 to be embodied equally. In an alternative embodiment of the invention, provision is made for the individual output stages 1 to be embodied with a graduated output power or amplification and/or for different frequency bands.

The individual output stages 1 are embodied together with the switching facility 2, preferably as an integrated circuit and integrated on a chip of the hearing aid device 10. By way of example, two, five, ten or even more output stages can be arranged on the integrated circuit. In such cases the individual output stages 1 are controlled by the same input signal. The output stages can be embodied according to known switching types, as emitter followers, as Darlington amplifiers, as complementary output stages, in digitalized form as class D output stages with H bridges or suchlike for instance.

If each output stage is embodied with an output power of 1 for instance, then a total output power of 3, with which the receiver 3 can be controlled, results with the parallel circuit of the three output stages 1. If the individual output stages 1 contrastingly have a different output power, graduated in 1, 3, 5, 10 steps for instance, then a corresponding activation of the switching facility 2 can control the overall output power depending on the position of the switching contacts in a corresponding fashion. The steps 1, 3, 5, 10 are corresponding power units.

In a further embodiment of the invention, provision is also made to embody the output stages 1 with a different frequency response. This enables the input signal to be increased and/or attenuated to varying degrees so that an improved hearing result and an improved dynamics can be achieved by changing the frequency response. Using the previously described multichannel output stage advantageously allows a simple classification of the power of the hearing aid device 10 to be achieved. The desired output power can be programmed in a simple fashion by selecting the different output stages 1 and/or operating a number of output stages in parallel.

FIG. 3 shows a second exemplary embodiment of the invention. The switching arrangement is the same as was previously explained in more detail in FIG. 2. However, in this case with the third output stage 1, an external protective element with passive components 4, 5 was arranged between the output of the switching facility 2 and the input terminals of the receiver 3. The passive elements are embodied for instance as resistors, R/C filters or as coupling capacitors. The external protective element can thus modify an individual output stage 1 with a specific output power and/or a predetermined frequency response. By connecting the individual output stages 1 in parallel, the frequency response can thus be predetermined for the signal to be transmitted.

FIG. 4 shows a third exemplary embodiment of the invention. With this exemplary embodiment, the three output stages 1 are once again connected to the switching facility 2. However, the individual output stages are in this case not connected in parallel. Instead, each output stage 1 is electrically connected to a separate receiver 3a, 3b, 3c in each instance by way of the switching facility 2. Furthermore, an external protective element with passive components 4, 5 is arranged upstream of each receiver 3a, 3b, 3c. The mode of operation of this arrangement is the same, as was already explained for the exemplary embodiments 1 and 2; the high frequencies can be more greatly emphasized using a coupling capacitor for instance.

Furthermore, provision is made for the individual receivers 3a, 3b, 3c to exhibit different characteristics. For instance, the three receivers are embodied for the woofer range, the tweeter range and the middle range. Dividing the audio frequencies enables the physically conditional and unavoidable noises to be more significantly suppressed and thus improves the comprehensibility of the useful signal. This is of particular importance for a significantly hearing-impaired patient.

The use of the multichannel system thus enables the different frequency ranges to be controlled separately and output to corresponding receivers 3a, 3b, 3c. The receivers 3a, 3b, 3c can be arranged in a housing, so that a particularly small design of hearing aid device is produced.

The invention claimed is:

1. A circuit arrangement for a hearing aid device, with the hearing aid device comprising a microphone, a signal processing unit, a power amplifier and a receiver, the circuit arrangement comprising:
   a controllable switching facility; and
   the power amplifier includes a plurality of output stages, each of the plurality of output stages embodied with an output and connected to the switching facility via the output in order for the output to influence a frequency responses, wherein the switching facility includes a switch associated with each of the plurality of output stages, and
   wherein via the switching facility, the output of each of the plurality of output stages are electrically connected to the receiver when a switch of the switching facility associated with the output stage is closed.

2. The circuit arrangement as claimed in claim 1, wherein each of the plurality of output stages is embodied to limit the maximum output power by the receiver, wherein each of the plurality of output stages is embodied with an individual output power in order to limit the maximum power.

3. The circuit arrangment as claimed in claim 2, wherein the output power of the output stages are of equal size in respect of one another.

4. The circuit arrangement as claimed in claim 2, wherein the output power of each of the plurality of output stages is embodied in predetermined graduated steps if the switch associated with the output stage is closed and the remaining switches in the switching facility are open.

5. The circuit arrangement as claimed in claim 1, wherein the output of each of the plurality of output stages is embodied to be switchable in a two-pole fashion.

6. The circuit arrangement as claimed in claim 1, wherein the switching facility comprises an electronic switching element, with which the output of each of the plurality of output stages are switched in parallel.

7. The circuit arrangement as claimed in claim 1, wherein an external protective element is arranged between the switching facility and the receiver.

8. The circuit arrangement as claimed in claim 7, wherein the external protective element is embodied with a passive component.

9. The circuit arrangement as claimed in claim 8, wherein the passive component is a resistor, a capacitor, an inductor or combinations thereof 10. The circuit arrangement as claimed in claim 1, wherein the hearing device comprises a plurality of receivers, wherein each of the plurality of output stages is connected to a separate receiver.

11. The circuit arrangement as claimed in claim 10, wherein each receiver is embodied with a different frequency response or driver compatibility.

12. The circuit arrangement as claimed in claim 1, wherein the circuit arrangement is embodied as an integrated circuit, and is integrated on a chip of a hearing aid device.

13. A method for selecting an a frequency response in a hearing aid device, comprising:
   providing the hearing aid device with a circuit arrangement according to claim 1; and
   selecting the frequency response of the hearing aid device by selectively switching from the plurality of output stages using the switch associated with each output stage, with the output of each of the plurality of output stages being switchable to a receiver and wherein the output power of each output stage is embodied in predetermined graduated steps if the switch associated with the output stage is closed and the switches associated with the remaining output stages are open.

14. The method as claimed in claim 13, wherein each of the plurality of output stages is embodied to limit the maximum output power by the receiver, wherein each of the plurality of output stages is embodied with an individual output power in order to limit the maximum power.

15. The method as claimed in claim 13, wherein the output of each of the plurality of output stages is embodied to be switchable in a two-pole fashion.

16. The method as claimed in claim 13, wherein the switching facility comprises an electronic switching element, with which the output of each of the plurality of output stages are switched in parallel.

17. The method as claimed in claim 16, wherein the output power of the output stages are of equal size in respect of one another.

18. The method as claimed in claim 13, wherein an external protective element is arranged between the switching facility and the receiver, and wherein the external protective element is embodied with a passive component.

19. The method as claimed in claim 13, wherein the hearing device comprises a plurality of receivers, wherein each of the plurality of output stages is connected to a separate receiver.

20. The method as claimed in claim 19, wherein each receiver is embodied with a different frequency response or driver compatibility.

* * * * *